US007807267B2

(12) United States Patent　　(10) Patent No.: US 7,807,267 B2
Kohmura et al.　　　　　　　　　　(45) Date of Patent: Oct. 5, 2010

(54) METHOD OF MODIFYING POROUS FILM, MODIFIED POROUS FILM AND USE OF SAME

(75) Inventors: Kazuo Kohmura, Sodegaura (JP); Shunsuke Oike, Sodegaura (JP); Takeshi Kubota, Sodegaura (JP); Masami Murakami, Sodegaura (JP); Yoshito Kurano, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 668 days.

(21) Appl. No.: 10/526,688

(22) PCT Filed: Sep. 8, 2003

(86) PCT No.: PCT/JP03/11445

§ 371 (c)(1),
(2), (4) Date: Mar. 3, 2005

(87) PCT Pub. No.: WO2004/026765

PCT Pub. Date: Apr. 1, 2004

(65) Prior Publication Data

US 2006/0040110 A1　　Feb. 23, 2006

(30) Foreign Application Priority Data

Sep. 9, 2002　(JP)　............................. 2002-262675
Mar. 13, 2003　(JP)　............................. 2003-067456

(51) Int. Cl.
*B32B 9/04* (2006.01)
(52) U.S. Cl. .............. 428/447; 427/255.14; 427/255.18
(58) Field of Classification Search ................. 428/447; 427/255.14, 255.18
See application file for complete search history.

(56) References Cited

U.S. PATENT DOCUMENTS

| 5,334,454 | A | 8/1994 | Caporiccio et al. | |
|---|---|---|---|---|
| 5,939,141 | A | 8/1999 | Cagliostro | |
| 6,208,014 | B1 * | 3/2001 | Wu et al. | 257/629 |
| 6,348,725 | B2 | 2/2002 | Cheung et al. | |
| 6,395,651 | B1 * | 5/2002 | Smith et al. | 438/787 |
| 6,448,331 | B1 | 9/2002 | Ioka et al. | |
| 6,674,140 | B2 * | 1/2004 | Martin | 257/415 |
| 6,770,572 | B1 * | 8/2004 | Wu et al. | 438/778 |
| 6,806,203 | B2 * | 10/2004 | Weidman et al. | 438/736 |
| 2002/0098714 | A1 | 7/2002 | Grill et al. | |

FOREIGN PATENT DOCUMENTS

| JP | 05-202478 | 8/1993 |
|---|---|---|
| JP | 2000-038509 | 2/2000 |
| JP | 2000-313612 | 11/2000 |
| JP | 2001-049174 | 2/2001 |
| WO | WO 91/11390 | 8/1991 |
| WO | WO 99/03926 | 1/1999 |
| WO | WO 00/39028 | 7/2000 |
| WO | WO 02/43119 | 5/2002 |

OTHER PUBLICATIONS

IUPAC Compendium of Chemical Terminology, , $2^{nd}$ edition, 1997, "mesopore".*
Ono, Tetsuo, et al. "Japanese Journal of Applied Physics", vol. 45, No. 8A, 2006, p. 6234.*
Yanagisawa, et al., The Preparation of Alkyltrimethylammonium-Kanemite Complexes and Their Conversion to Miicroporous Materials, Bull. Chem. Soc. Jp., vol. 63, pp. 988-992, 1990 Japan.
Yang, et al., Synthesis of Oriented Films of Mesoporous Silica of Mica, Letter of Nature, vol. 379, pp. 703-705, 1996 Canada.
Miyata, et al., Preferred Alignment of Mesochannels in a Mesoporous Silica Film Grown on a Silicon (110) Surface, J. Am. Chem. Soc., vol. 121, pp. 7618-7624, 1999 Japan.
Ogawa, Preparation of Transparent Thin Films of Silica-Surfactant Mesostructured Materials, Supramolecular Science, vol. 5, pp. 247-251, 1998 Japan.
Zhao, et al., Continuous Mesoporous Silica Films With Highly Ordered Large Pore Structures, Advanced Materials, vol. 10, pp. 1380-1385, 1998 USA.
Lu, et al., Continuous Formation of Supported Cubic and Hexagonal Mesoporous Films by Sol-Gel Dip-Coating, Letters of Nature, vol. 389, pp. 364-368, 1997 New Mexico.
Lu, et al., Aerosol-Assisted Self-Assembly of Mesostructured Spherical Nanoparticles, Letters of Nature, vol. 398, pp. 223-226, 1999 New Mexico.
Zhao, et al., Comprehensive Study of Surface Chemistry of MCM-41 Using 29SI CP/MAS NMR, FTIR. Pyridine-TPD, and TGA, J. Phys. Chem. B. vol. 101, pp. 6525-6531, 1997 Australia.
Takei, et al., Water Adsorption Properties on Porous Silica Glass Surface Modified by Trimethylsilyl Groups, Journal of Colloid and Interface Science, No. 188, pp. 409-414, 1997 Japan.

(Continued)

*Primary Examiner*—Margaret G Moore
(74) *Attorney, Agent, or Firm*—Turocy & Watson, LLP

(57) ABSTRACT

The present invention relates to a method for modifying a porous film mainly having Si—O bonds wherein a thermal treatment is conducted without using a metal catalyst by bringing an organic silicon compound into contact with the porous film. The organic silicon compound includes one or more Si—X—Si bond unit (wherein X represents O, NR, $C_nH_{2n}$, or $C_6H_4$; R represents $C_mH_{2m+1}$ or $C_6H_5$; m is an integer between 1 and 6; and n is 1 or 2) and two or more Si-A bond units (wherein A represents H, OH, $OC_eH_{2e+1}$ or a halogen atom and can be the same or different within a single molecule; and e is an integer between 1 and 6). Since the porous film obtained by this method is excellent in the hydrophobic property and the mechanical strength, it can be used as an optically functional material or an electronically functional material. The porous film is especially useful as a semiconductor material, and can be preferably used as an interlayer insulating film in a semiconductor device.

13 Claims, No Drawings

OTHER PUBLICATIONS

Chen, et al., Microstructure and Mechanical Properties of Surfactant Templated Nanoporous Silica Thin Films: Effect of Methylsilylation, Journal of Electrochemical Society, vol. 150, No. 6, pp. F123-F127, 2003 Taiwan.

Joo, et al., Fabrication of Novel Mesoporous Dimethylsiloxane-Incorporated Silicas, Chem. Commun., pp. 1487-1488, 2000 Korea.

Fukui, Reactive Ultra-Thin Film Coating on Powder by CVD of Cyclic Siloxane, Journal of Surface Science Society of Japan, vol. 22., pp. 9-18, 2001 Japan.

Fujita, et al., Notable Improvement in Porous Low-K Film Properties Using Electron-Beam Cure Method, litc., pp. 106-108, 2003 Japan.

* cited by examiner

METHOD OF MODIFYING POROUS FILM, MODIFIED POROUS FILM AND USE OF SAME

TECHNICAL FIELD

The present invention relates to a method for modifying a porous film, a modified porous film according to the modification method, a semiconductor material using the modified porous film and a semiconductor device. More particularly, the invention relates to a modified porous film which is excellent in the hydrophobic property and the mechanical strength and which can be used as an optically functional material, an electronically functional material or the like, and a method for modifying a porous film in order to obtain the same.

BACKGROUND ART

Conventionally, as a porous material having Si—O bonds, there has been known zeolite or silica gel. Zeolite is a silica crystal having uniform pores, but there is no zeolite that has the pore diameter of exceeding 13 Å. Furthermore, silica gel has pores having the meso area in the range of 2 to 50 nm, but its pore size distribution is not uniform. Accordingly, these materials have only been used for limited purposes.

Contrary to this, a porous inorganic compound having uniform mesopores has uniform pores in the meso area, and has a large pore volume and a large surface area so that it has been expected to be used for a catalyst carrier, a separation adsorbent, a fuel battery and a sensor.

As for a process for preparing such an oxide having uniform mesopores, a process utilizing control of the structure of an inorganic material by the use of an organic compound has been paid attention because an oxide of novel shape and structure can be obtained. In particular, an oxide having uniform mesopores, which is synthesized by utilizing self-assembly of an organic compound and an inorganic compound, is known to have a larger pore volume and a larger surface area than conventional oxides. An oxide having uniform mesopores mentioned herein refers to one in which existence of the diffraction peak showing a periodic arrangement of a structure is confirmed by measurement according to the X-ray diffractometry because pores are regularly disposed in an oxide (a periodic pore structure).

As a process for preparing an oxide having uniform mesopores utilizing self-assembly of an organic compound and an inorganic compound, there is described a process, for example, in WO91/11390. In the cited reference, a process comprising subjecting silica gel, a surface active agent or the like to hydrothermal synthesis reaction in a closed heat-resistant vessel to prepare such an oxide is described. Furthermore, in *Bull. Chem. Soc. Jp.*, Vol. 63, p. 988 (1990), a process comprising subjecting kanemite that is a kind of a layered silicate and a surface active agent to ion exchange to prepare such an oxide is described.

As an oxide having uniform mesopores prepared by this method has recently been used for an optically functional material, an electronically functional material or the like, it has been prepared in a shape of a film.

For example, in Nature, Vol. 379, p. 703 (1996) and J. Am. Chem. Soc., Vol. 121, p. 7618 (1999), a process comprising immersing a substrate in a sol-containing solution including a condensate of alkoxysilane and a surface active agent, and precipitating porous silica on a surface of a substrate to form a film is described. In addition, in Supramolecular Science, Vol. 5, p. 247 (1998), Adv. Mater., Vol. 10, p. 1380 (1998), Nature, Vol. 389, p. 364 (1997) and Nature, Vol. 398, p. 223 (1999), a process comprising coating a substrate with a solution in which a condensate of alkoxysilane and a surface active agent are dissolved in an organic solvent and subsequently evaporating the organic solvent to form a film on the substrate is described.

Among these methods, the former process comprising precipitating porous silica on the surface of the substrate has disadvantages such that it requires a long time to form a film and porous silica is precipitated in a shape of powder in many cases, thus resulting in reducing the yield. For this reason, to form a porous silica film, the latter process comprising evaporating the organic solvent is excellent.

In the process comprising evaporating the organic solvent to form a film on a substrate, examples of a solvent used, including a polyhydric alcohol ether solvent, a glycol ether acetate solvent, an amide series solvent, a ketone series solvent, a carboxylic acid ester solvent and the like are cited in JP2000-38509A. Furthermore, solvents such as an organic solvent having amide bonds and an organic solvent having ester bonds are cited in WO99/03926.

On the other hand, in late years, when this porous silica film is used for an optically functional material, an electronically functional material or the like, there has been a problem that both low moisture adsorption property and high mechanical strength of a film are needed. For example, a porous silica film, when used for an interlayer insulating film in a semiconductor as an electronically functional material, is favorable as a film with a very low relative permittivity because the ratio of a pore having the relative permittivity of 1 is high, but being porous, such a film considerably deteriorates the mechanical strength.

For this reason, as a process for preventing water from adsorbing, a process comprising introducing a hydrophobic functional group into an interlayer insulating film material has been proposed. However, a process for improving the mechanical strength at the same time has not been reported up to now. For example, in WO00/39028 and U.S. Pat. No. 6,208,014, a process for preventing water from adsorbing by trimethylsilylating silanol groups in the pore has been proposed. However, it is not possible to completely trimethylsilylating silanol groups in the pore with this method, which has been reported in *J. Phys. Chem.*, Vol. B1997-101, p. 6525 and *J. Colloid Interface Sci.*, Vol. 188, p. 409 (1997). Further, regarding the mechanical strength, the process does not have any effect, which has been reported in *J. Electrochem. Soc.*, Vol. 150-6, p. F123 (2003).

Furthermore, in JP2001-049174A, a process for forming a porous silica film by a coating solution prepared by using a copolycondensate (cogelated product) of methyltrialkoxysilane and tetraalkoxysilane has been proposed. This process improves the hydrophobic property of the porous silica film obtained by using a coating solution in which the content of methyltrialkoxysilane, i.e., a hydrophobic component, is increased. However, when the content of methyltrialkoxysilane is increased, the ratio of three dimensional bond unit of Si—O—Si bonds forming a skeleton of the porous silica film is reduced; therefore, the mechanical strength is remarkably deteriorated. Accordingly, it has been difficult to have both the hydrophobic property and the mechanical strength at the same time.

In addition, in *Chem. Commun.*, p. 1487 (2000), a process for producing a hydrophobic mesoporous silica powder by partially hydrolyzing dimethylalkoxysilane and tetraalkoxysilane respectively and then mixing them has been reported. A powder obtained by this process has a periodic pore structure even if dialkylalkoxysilane is introduced in a relatively high amount and has the excellent hydrophobic property.

However, in this process, as it takes several days for the preparation, it is not practical. Further, as a powder is finally obtained, it is difficult to apply it to an optically functional material, an electronically functional material or the like.

Furthermore, in *The Journal of Surface Science Society of Japan*, Vol. 22, p. 9 (2001), it has been reported that a powder obtained by thin coating of tetramethyltetracyclosiloxane, i.e., a cyclic siloxane compound on a powder surface exhibits the hydrophobic property. In this case, however, as a powder is finally obtained, it is difficult to apply it to an optically functional material, an electronically functional material or the like.

Furthermore, in U.S. Pat. No. 5,939,141, a process for making hydrophobic by forming a film by vapor decomposition of a low molecular weight silane compound onto the surface of a porous ceramic material in the presence of a platinum catalyst has been reported. However, in order to form a film according to this process, a metal must be present as a catalyst and accordingly the metal is present in a film. Therefore, when such a film is used for an electronically functional material, it might have a bad effect on the electric properties such that the relative permittivity is increased or the like. So, it is not preferable.

On the other hand, in JP1993-202478A, U.S Publication No. 2002098714, WO02/043119, and U.S. Pat. No. 6,348,725, a process for forming a film of a cyclic siloxane compound on a substrate by the plasma CVD technique has been reported. This process is to form a film by decomposing the cyclic siloxane compound into plasma and depositing it on a substrate. For this reason, the thus-obtained film has a very low porosity. For example, low relative permittivity that is required when the film is used for an interlayer insulating film in a semiconductor cannot be expected. Further, to generate plasma, a very expensive device is needed. Thus, this process is not economically desirable.

In order to enhance the film strength, there has been reported a process by excimer beam (EB) cure as described in *Proceedings of IITC*, p. 106 (2003). This process comprises placing a porous film on a single wafer heating stage installed in a vacuum chamber and performing EB cure at 350° C. in an argon atmosphere, under a condition of 10 Torr, thereby improving the mechanical strength by 1.5 times. However, this treatment has disadvantages such that expensive equipment is required and as a result of the treatment, a film thickness becomes reduced. A change in the film thickness is not preferable when such a film is used as an optically functional material or an electronically functional material.

As described above, the technology to prepare a porous film which satisfies both the hydrophobic property and the film strength has not yet been sufficient.

DISCLOSURE OF THE INVENTION

In order to solve the problems accompanied by the prior arts as described above, the present invention is to provide a method for modifying a porous film to obtain a porous film which is excellent in the hydrophobic property and the mechanical strength, and which can be used as an optically functional material or an electronically functional material, the modified porous film according to the method, a semiconductor material comprising the thus-obtained porous film, and a semiconductor device in which the semiconductor material is used.

As a result of an extensive study in order to achieve the above objects, the present inventors have found that a modified porous film which was excellent in the hydrophobic property and the mechanical strength could be obtained by conducting a thermal treatment without using a metal catalyst by bringing an organic silicon compound into contact with the porous film mainly having Si—O bonds. The organic silicon compound includes a bond unit in which a specific atom or group is bonded to Si. Thus, the present invention has been completed.

That is, the present invention relates to a method for modifying a porous film mainly having Si—O bonds, wherein a thermal treatment is conducted without using a metal catalyst by bringing an organic silicon compound including one or more Si—X—Si bond unit (wherein X represents O, NR, $C_nH_{2n}$, or $C_6H_4$; R represents $C_mH_{2m+1}$ or $C_6H_5$; m is an integer between 1 and 6; and n is 1 or 2) and two or more Si-A bond units (wherein A represents H, OH, $OC_eH_{2e+1}$ or a halogen atom; e is an integer between 1 and 6; and A may be the same or different within a single molecule) into contact with the porous film.

It is preferable that the aforementioned thermal treatment is conducted at a temperature of from 100 to 600° C.

It is preferable that the porous film before the aforementioned thermal treatment is a film having mesopores.

Furthermore, it is preferable that the average pore diameter of the porous film before the aforementioned thermal treatment is from 0.5 to 10 nm.

It is preferable that the aforementioned organic silicon compound is a cyclic siloxane.

The modified porous film of the present invention is characterized in that it is obtained by the aforementioned method.

Furthermore, the semiconductor material of the present invention is characterized in that it comprises the aforementioned modified porous film.

Furthermore, the semiconductor device of the present invention is characterized in that the aforementioned semiconductor material is used.

According to the present invention, it is possible to provide a porous film which is excellent in both the hydrophobic property and the mechanical strength at the same time and which can be used for an optically functional material or an electronically functional material. The porous film can be very suitably used for an interlayer insulating film as a semiconductor material.

BEST MODE FOR CARRYING OUT THE INVENTION

The modified porous film according to the present invention which is excellent in the hydrophobic property and the mechanical strength is obtained by the thermal treatment without using a metal catalyst by bringing an organic silicon compound into contact with the porous film. The organic silicon compound includes a specific structure unit and a group bonded to a specific Si. Firstly, the porous film used for the modification treatment will be described below.

Porous Film

A porous film mentioned herein refers to a structure in which water molecules can freely infiltrate from outside, which has an opening having a diameter (a diameter of a pore in the present invention refers to that of the maximum inscribed circle) of less than 100 nm and has lots of pores in which the maximum depth from the opening is larger than the diameter of the opening. This pore, in case of a film obtained by compressing particles, includes voids between particles.

Furthermore, the porous film to be used for the modification treatment of the present invention is a porous film mainly having Si—O bonds and may partially contain organic atoms.

Having Si—O bonds means that at least two or more O atoms are boned to one Si atom, other Si atoms are bonded through the O atoms. Besides, there is no other particular restriction. For example, it does not matter if hydrogen, halogen, an alkyl group, a phenyl group or a functional group comprising these is bonded to silicon.

The ratio of Si to O in the porous film is confirmed by atom analysis according to XPS, which is preferably in the range of $0.5 \leqq Si/O$ (atom ratio)$\leqq 1.0$ and weight fraction of Si is preferably not less than 40 weight %. Furthermore, Si—O bonds are confirmed by IR. Films in general include films comprising silica, hydrogen silsesquioxane, methylsilsesquioxane, hydrogen methylsilsesquioxane, dimethylsiloxane or the like.

Furthermore, it does not matter if the porous film of the present invention is pre-treated with a generally known surface active agent having a methyl group, a hydrogen group or the like on its surface. For example, such porous films treated with hexamethyldisilazane (HMDS), trimethylsilylchloride (TMSC), monosilane or the like can be used.

It is preferable that the porous film to be modified according to the present invention has mesopores. Furthermore, the average pore diameter is preferably in the range of 0.5 to 10 nm. Within this range, sufficient mechanical strength and low permittivity can be achieved at the same time according to the modification treatment to be described later.

Generally speaking, the average pore diameter of the film can be measured using Autosorb-3B (manufactured by Quantachrome Instruments), i.e., a 3-sample system of a full automatic gas adsorption apparatus. In this case, measurement of the average pore diameter is carried out using the nitrogen adsorption method under a liquid nitrogen temperature (77K), the specific surface area can be measured by the BET method, and the pore size distribution can be obtained by the BJH method.

The porous film which is modified according to the present invention is not particularly restricted as far as it is one of the above films. However, if the porous film is classified according to the preparation method, (1) a film which is porosified by forming a film with alkoxysilane using a sol-gel method, (2) a film which is porosified by self-assembly of silica sol and an organic compound, and removing the organic compound after forming a film, and (3) a film which is porosified by crystal growth of zeolite on a surface of a substrate and the like can be cited.

The porous film obtained by these preparation methods will be described below.

(1) A Film which is Porosified by Forming a Film with Alkoxysilane Using a Sol-Gel Method According to this method, as far as a porosified film is obtained, its preparation method is not particularly restricted. Specifically, it can be prepared by the following example.

Firstly, a coating solution for forming a film is prepared. The coating solution can be obtained by adding components to be described later such as alkoxysilane, a catalyst and water thereto or further adding a solvent as required and by stirring at a temperature of from 0 to 70° C. and preferably from 30 to 50° C. for several minutes to 5 hours and preferably for 1 to 3 hours. First of all, the aforementioned respective components are described.

(Alkoxysilane)

Specific examples of alkoxysilane to be used for forming a porous film include, though not particularly restricted to, tetraalkoxysilane such as tetramethoxysilane, tetraethoxysilane, tetraisopropoxysilane, tetrabutylsilane and the like; trialkoxyfluorosilane such as trimethoxyfluorosilane, triethoxyfluorosilane, triisopropoxyfluorosilane, tributhoxyfluorosilane and the like; fluorine-containing alkoxysilane such as $CF_3(CF_2)_3CH_2CH_2Si(OCH_3)_3$, $CF_3(CF_2)_5CH_2CH_2Si(OCH_3)_3$, $CF_3(CF_2)_7CH_2CH_2Si(OCH_3)_3$, $CF_3(CF_2)_9CH_2CH_2Si(OCH_3)_3$, $(CF_3)_2CF(CF_2)_4CH_2CH_2Si(OCH_3)_3$, $(CF_3)_2CF(CF_2)_6CH_2CH_2Si(OCH_3)_3$, $(CF_3)_2CF(CF_2)_8CH_2CH_2Si(OCH_3)_3$, $CF_3(C_6H_4)CH_2CH_2Si(OCH_3)_3$, $CF_3(CF_2)_3(C_6H_4)CH_2CH_2Si(OCH_3)_3$, $CF_3(CF_2)_5(C_6H_4)CH_2CH_2Si(OCH_3)_3$, $CF_3(CF_2)_7(C_6H_4)CH_2CH_2Si(OCH_3)_3$, $CF_3(CF_2)_3CH_2CH_2SiCH_3(OCH_3)_2$, $CF_3(CF_2)_5CH_2SiCH_3(OCH_3)_2$, $CF_3(CF_2)_7CH_2CH_2SiCH_3(OCH_3)_2$, $CF_3(CF_2)_9CH_2CH_2SiCH_3(OCH_3)_2$, $(CF_3)_2CF(CF_2)_4CH_2CH_2SiCH_3(OCH_3)_2$, $(CF_3)_2CF(CF_2)_6CH_2CH_2SiCH_3(OCH_3)_2$, $(CF_3)_2CF(CF_2)_8CH_2CH_2SiCH_3(OCH_3)_2$, $CF_3(C_6H_4)CH_2CH_2SiCH_3(OCH_3)_2$, $CF_3(CF_2)_3(C_6H_4)CH_2CH_2SiCH_3(OCH_3)_2$, $CF_3(CF_2)_5(C_6H_4)CH_2CH_2SiCH_3(OCH_3)_2$, $CF_3(CF_2)_7(C_6H_4)CH_2CH_2SiCH_3(OCH_3)_2$, $CF_3(CF_2)_3CH_2CH_2Si(OCH_2CH_3)_3$, $CF_3(CF_2)_5CH_2CH_2Si(OCH_2CH_3)_3$, $CF_3(CF_2)_7CH_2CH_2Si(OCH_2CH_3)_3$, $CF_3(CF_2)_9CH_2CH_2Si(OCH_2CH_3)_3$ and the like; trialkoxyalkylsilane such as trimethoxymethylsilane, triethoxymethylsilane, trimethoxyethylsilane, triethoxyethylsilane, trimethoxypropylsilane, triethoxypropylsilane and the like; trialkoxyarylsilane such as trimethoxyphenylsilane, triethoxyphenylsilane, trimethoxychlorophenylsilane, triethoxychlorophenylsilane and the like; trialkoxyphenethylsilane such as trimethoxyphenethylsilane, triethoxyphenethylsilane and the like; dialkoxyalkylsilane such as dimethoxydimethylsilane, diethoxydimethylsilane and the like. Among these, use of tetraethyoxysilane is preferable.

These alkyoxysilanes may be used singly or in combination of two or more kinds.

(Catalyst)

As a catalyst used for the preparation of a coating solution, at least one selected from an acid catalyst or an alkali catalyst can be used.

Examples of the acid catalyst include an inorganic acid and an organic acid. Examples of the inorganic acid include hydrochloric acid, nitric acid, sulfuric acid, fluoric acid, phosphoric acid, boric acid, hydrobromic acid and the like. Meanwhile, examples of the organic acid include acetate, propionic acid, butanoic acid, pentanoic acid, hexanoate, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoate, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, itaconic acid, mesaconic acid, citraconic acid, malic acid and the like.

Examples of the alkali catalyst include ammonium salts and nitrogen-containing compounds. Examples of ammonium salts include tetramethylammonium hydroxide, tetraethylammonium hydroxide, tetrapropylammonium hydroxide, tetrabutylammonium hydroxide and the like. Examples of nitrogen-containing compounds include pyridine, pyrrol, piperidine, 1-methylpiperidine, 2-methylpiperidine, 3-methylpiperidine, 4-methylpiperidine, piperazine, 1-methylpiperazine, 2-methylpiperazine, 1,4-dimethylpiperazine, pyrrolidine, 1-methylpyrrolidine, picoline, monoethanolamine, diethanolamine, dimethyl monoethanolamine, monomethyl diethanolamine, triethanolamine, diazabicyclooctane, diazabicyclononane, diazabicycloundecene, 2-pyrazoline, 3-pyrroline, quinuclidine, ammonia, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine and the like.

(Solvent)

As a solvent which can be used for the preparation of a coating solution, there can be mentioned, for example, monoalcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethyl carbinol, diacetone alcohol, cresol and the like; polyhydric alcohol solvents such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, glycerine and the like; ketone solvents such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, 2-hexanone, methylcyclohexanone, 2,4-pentanedione, acetonylacetone, diacetone alcohol, acetophenone, fenthion and the like; ether solvents such as ethyl ether, i-propyl ether, n-butyl ether, n-hexyl ether, 2-ethyl hexyl ether, ethylene oxide, 1,2-propylene oxide, dioxolane, 4-methyldioxolane, dioxane, dimethyidioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monomethyl ether, tripropylene glycol monomethyl ether, tetrahydrofuran, 2-methyltetrahydrofuran and the like; ester solvents such as diethyl carbonate, methyl acetate, ethyl acetate, □-butyrolactone, □-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate and the like; nitrogen-containing solvents such as N-methylformamide, N,N-dimethylformamide, N,N-diethylformamide, acetamide, N-methylacetamide, N,N-dimethylacetamide, N-methylpropionamide, N-methylpyrrolidone and the like.

The solvent can be used singly or in combination of two or more kinds selected from the foregoing solvents.

The method for adding each of these components is arbitrary and the order of addition is not particularly restricted. Addition of water to alkoxysilane may be carried out two times in order to control the hydrolysis and dehydrocondensation of alkoxysilane. For addition of water in the first time, in order not to complete hydrolysis and dehydrocondensation, the alkoxyl group (molar ratio) of water to alkoxysilane may be in the range of 0.1 to 0.3 and preferably in the range of 0.2 to 0.25. Addition of water in the second time may be arbitrary, but the alkoxy group (molar ratio) of water to alkoxysilane may be in the range of 1 to 10. The time required for between addition of water in the first time and that in the second time is not particularly restricted and can be arbitrarily set. The amount of a catalyst added may be in any range as far as it can promote the reaction and the molar ratio of alkoxysilane to a catalyst is preferably 1:0.1 to 0.001. When a solvent is employed for dilution, the ratio of dilution is in the range of 1 to 100 times and preferably in the range of 3 to 20 times.

The alkoxysilane, catalyst and water, or a solvent as required are further added. A substrate is coated with a coating solution which is obtained by stirring the resulting mixture for about several minutes to 5 hours to obtain a precursor of a porous film. The porosity conditions of a film can be controlled by varying the kind of a solvent or alkoxysilane to be used. Pores are formed by evaporation of a solvent by drying and calcining or the removal of an alcohol component generated by the hydrolysis and a porous film is obtained.

As a substrate to be used for forming a porous film, any substrate that is generally used can be employed. Examples of the substrate include glass, quarts, silicon wafer, stainless steel and the like. Furthermore, the substrate may have any shape including a plate, dish or the like.

Examples of methods for coating a substrate include general methods such as a spin coating method, a cast coating method, a dip coating method and the like. In case of a spin coating method, a substrate is placed on a spinner, a sample is dropped on the substrate, and the substrate is rotated at from 500 to 10,000 rpm, whereby a porous film having a uniform thickness in which the film surface is excellent in smoothness can be obtained.

Upon drying and calcination to remove the solvent and the alcohol component generated by the hydrolysis of alkoxysilane, the drying conditions are not particularly restricted, and any condition is available as far as the solvent or alcohol component can be evaporated. The calcining conditions are not particularly restricted, and any condition is available as far as the condensation of a silanol group in a film according to the calcination can be further promoted. Accordingly, the calcination may be carried out in the atmosphere or inert gas or in vacuo. However, when H or a methyl group is present in a film, a temperature where the decomposition to H and a methyl group does not occur is required for the calcination. Specifically, the calcination is desirably carried out at from 250 to 450° C. in a nitrogen atmosphere.

Furthermore, the solvent and the alcohol component generated by the hydrolysis of alkoxysilane can also be removed by a supercritical fluid or an organic solvent having small surface tension. In particular, the removal by the supercritical fluid having no surface tension by regulating pressure and temperature is preferable as pores of the film are not broken and a highly porous film can be obtained.

In these preparation methods, the porous film can be obtained at a state that it is in a self-supporting state or it is stuck to a substrate. Pores of the thus-obtained film are confirmed to have the average pore diameter in the range of 0.5 to 10 nm by cross sectional TEM observation of a film or measurement of the pore size distribution. Further, a film thickness is different depending on the preparation conditions, but it is in the range of approximately 0.05 to 2 μm.

(2) A Film which is Porosified by Self-Assembly of Silica Sol and an Organic Compound when Forming a Film with Alkoxysilane by a Sol-Gel Method and Removing the Organic Compound after Forming a Film A film which is porosified by self-assembly of silica sol and an organic compound when forming a film with alkoxysilane by a sol-gel method and removing the organic compound after forming a film can be obtained from a coating solution in which as a pore forming agent (a mold), for example, an organic compound such as a surface active agent is further added in a process for preparing a coating solution using alkoxysilane in the preparation of the aforementioned film (1).

As the aforementioned surface active agent, usually a compound having a long-chain alkyl group and a hydrophilic group can be used. The long-chain alkyl group is preferably one having 8 to 24 carbon atoms and further preferably one having 12 to 18 carbon atoms. Further, examples of the hydrophilic group include a quaternary ammonium salt, an amino group, a nitroso group, a hydroxyl group, a carboxyl group and the like. Among these, a quaternary ammonium salt or a hydroxyl group is preferable.

Specifically, as the surface active agent, it is preferable to use an alkylammonium salt represented by the following general formula:

$$C_nH_{2n+1}(N(CH_3)_2(CH_2)_m)_a(CH_2)_bN(CH_3)_2C_LH_{2L+1}X_{1+a}$$

wherein a is an integer between 0 and 2; b is an integer between 0 and 4; n is an integer between 8 and 24; m is an integer between 0 and 12; L is an integer between 1 and 24; and X is a halide ion, $HSO_4^-$ or a monovalent organic anion.

The surface active agent represented by the aforementioned general formula forms micelles in a coating solution to be regularly disposed. In the present invention, the micelle acts as a mold, so silica obtained by the hydrolysis and dehydrocondensation of alkoxysilane and a surface active agent form a complex. Then, by removing the surface active agent of the mold, a porous film having uniform pores regularly disposed can be prepared.

Furthermore, as the surface active agent, a compound having a polyalkylene oxide structure is also employable. Examples of the polyalkylene oxide structure include a polyethylene oxide structure, a polypropylene oxide structure, a polytetramethylene oxide structure, a polybutylene oxide structure and the like.

Specific examples of a compound having the polyalkylene oxide structure include ether type compounds such as polyoxyethylene polyoxypropylene block copolymer, polyoxyethylene polyoxybutylene block copolymer, polyoxyethylene polyoxypropylene alkyl ether, polyethylene alkyl ether, polyoxyethylene alkyl phenyl ether and the like; and ether ester type compounds such as polyoxyethylene glycerine fatty acid ester, polyoxyethylene sorbitan fatty acid ester, polyethylene sorbitol fatty acid ester, sorbitan fatty acid ester, propylene glycol fatty acid ester, sucrose fatty acid ester and the like.

In the present invention, a surface active agent can be used singly or in combination of two or more selected from the aforementioned compounds.

The content of alkoxysilane, a catalyst and water added is the same as the aforementioned method (1), the content of the surface active agent added is preferably in the range of 0.002 to 0.6 time and more preferably in the range of 0.005 to 0.15 time based on the molar ratio of the alkoxysilane. The surface active agent may be added in any state of a solid, a liquid or a solution obtained by dissolving the surface active agent in a solvent, regardless of its shape.

By changing combination, the molar ratio or the like between the surface active agent and the alkoxysilane, a porous film having a periodic pore structure such as a 2D-hexagonal structure, a 3D-hexagonal structure, a cubic structure or the like can be prepared according to the foregoing method (2).

In order to obtain such porous films, as described in the foregoing method (1), with the coating solution obtained according to the foregoing method, a substrate is coated and the solution is dried. Then, the surface active agent may be removed by calcining or extraction by an organic solvent. Pores of the thus-obtained film can be confirmed to have the average pore diameter in the range of 1 to 10 nm by cross sectional TEM observation of a film or the measurement of pore size distribution. Also, when the porous film has a periodic pore structure such as a 2D-hexagonal structure, a 3D-hexagonal structure, a cubic structure or the like, a diffraction peak at area intervals in the range of 1.3 to 13 nm can be confirmed by the X-ray diffractometry (CuK□).

When the thus-obtained porous film has pores of a cubic structure and particularly has a pore narrow part having a spacing of from 1 to 40 Å between the pore walls in pores and preferably from 2 to 25 Å, the pore narrow part can be easily blocked by the modification treatment to be described later so that a porous film in which at least a part of the pore narrow part is blocked can be obtained. The measurement of this pore narrow part size can be confirmed by the electron beam structure analysis. The thus-obtained porous film is excellent in the hydrophobic property. Further, when it is used for a semiconductor material, such a porous film can prevent diffusion of a barrier metal.

The porous film having the pore narrow part can be obtained from a porous film having a 2D-hexagonal structure or a 3D-hexagonal structure in which a narrow part is formed in a pore, in addition to a porous film having a cubic structure.

For example, a coating solution is prepared by partial hydrolysis and dehydrocondensation of alkoxysilane in the presence of a surface active agent and silicon oil. In this case, it is preferable that a mixed solution is prepared by mixing a surface active agent with silicon oil in advance and the resulting mixture is added to alkoxysilane which is partially hydrolyzed and dehydrocondensed. Here, the term "partially hydrolyzed and dehydrocondensed" means a state that the mixed solution is fluidized without being gelated. In general, if the viscosity exceeds $10^5$ poise, a solution is viewed as gelated. So, the solution has not more than the foregoing viscosity.

By preparing a coating solution in this manner, it is considered that a surface active agent is arranged centering on silicon oil to form micelles. Then, with the coating solution, a substrate is coated and the solution is dried. Then, when the surface active agent is removed by calcining, it is considered that the silicon oil put in the center of micelles remains in a state attached to the surface within pores of the porous film so that the aforementioned narrow part is formed.

The foregoing silicon oil includes, though not particularly restricted to, an organic silicon compound having polydimethylsiloxane as a main component. Examples of such compounds include trimethylsiloxy-terminated polydimethylsiloxane, a copolymer of polyphenylsiloxane and polydimethylsiloxane, a copolymer of polyphenylmethylsiloxane and polydimethylsiloxane, a copolymer of poly-3,3,3-trifluoropropylmethylsiloxane and polydimethylsiloxane, a copolymer of polyethylene oxide and polydimethylsiloxane, a copolymer of polypropylene oxide and polydimethylsiloxane, a copolymer of polyethylene oxide, polypropylene oxide and polydimethylsiloxane, hydride-terminated polydimethylsiloxane, a copolymer of polymethylhydridesiloxane and polydimethylsiloxane, silanol-terminated polydimethylsiloxane and the like.

The silicon oil to be used for the present invention can be used singly or in combination of two or more selected from the foregoing compounds.

The amount of the silicon oil added is preferably in the range of 1 to 100 weight parts and more preferably in the range of 5 to 50 weight parts, based on 100 weight parts of the alkoxysilane. When the amount of the silicon oil added is within the aforementioned range, a porous film in which a narrow part is formed within pores can be easily prepared.

In the porous film in which at least a part of the pore narrow part is blocked, the fact that the pore narrow part is blocked and improvement of the hydrophobic property can be confirmed by the measurement of relative permittivity and cross sectional TEM observation of a film to be described later.

(3) A Film which is Porosified by Crystal Growth of Zeolite on a Surface of a Substrate A film which is porosified can be obtained by crystal growth of zeolite on a surface of a substrate. The preparation method specifically includes, though not particularly restricted to, the following methods.

(A) With a coating solution comprising crystallite of zeolite obtained by hydrothermal synthesis with a silica source of alkoxysilane, colloidal silica or the like and a mold of organic amine, a substrate is coated. The solution is dried and calcined to prepare a porous film.

(B) A surface active agent is added to a coating solution comprising crystallite of zeolite obtained by hydrothermal synthesis with a silica source of alkoxysilane, colloidal silica or the like and a mold of organic amine. And then with the coating solution, a substrate is coated. The solution is dried and calcined to prepare a porous film.

(C) In hydrothermal synthesis with a silica source of alkoxysilane, colloidal silica or the like and a mold of organic amine, a substrate is inserted for crystal growth of zeolite on a surface of a substrate. Then, the solution is dried and calcined to prepare a porous film.

(D) After a substrate coated with silica gel is subject to zeolite crystallization in aqueous vapor containing an organic amine, the solution is dried and calcined to prepare a porous film (dry gel conversion).

As for the organic amine which can be used for the foregoing preparation, there can be exemplified, for example, tetrapropylammonium hydroxide, tetraethylammonium hydroxide, tetrabutylammonium hydroxide, tetrapentylammonium hydroxide, tripropylamine, triethylamine, triethanolamine, piperidine, cyclohexylamine, neopentylamine, isopropylamine, t-butylamine, 2-methylpyridine, N,N'-dimethylbenzylamine, N,N-diethylethanolamine, di(n-butyl)amine, di(n-pentyl)amine, dicyclohexylamine, N,N-dimethylethanolamine, cholin, N,N-dimethylpiperazine, 1,4-diazabicyclo(2,2,2)octane, N-methyldiethanolamine, N-methylethanolamine, N-methylpiperidine, quinuclidine, N,N'-dimethyl-1,4-diazabicyclo(2,2,2)octane dihydroxide, ethylenediamine, 2-imidazolidone and the like.

The porous film obtained is confirmed to have a zeolite structure from the diffraction peak obtained by the X-ray diffractometry (CuK□).

Modification Method of a Porous Film

A method for modifying a porous film of the present invention comprises conducting a thermal treatment without using a metal catalyst by bringing an organic silicon compound into contact with the foregoing porous film for improving the hydrophobic property and the mechanical strength. The organic silicon compound includes one or more Si—X—Si bond unit (wherein X represents O, NR, $C_nH_{2n}$, or $C_6H_4$; R represents $C_mH_{2m+1}$ or $C_6H_5$; m is an integer between 1 and 6; and n is 1 or 2) and two or more Si-A bond units (wherein A represents H, OH, $OC_eH_{2e+1}$ or a halogen atom and may be the same or different within a single molecule; and e is an integer between 1 and 6).

Of the organic silicon compounds having one or more Si—X—Si bond unit and two or more Si-A bond units, some of them exhibit the vapor pressure at a temperature in the range of 100 to 600° C. Further, it is preferable that no decomposition occurs at a state that the compound alone is present. In addition, the organic silicon compound needs to have the molecule diameter to be sufficiently diffused in pores of the porous film. The molecular weight is preferably not more than 900 and not less than 70, more preferably not more than 600 and not less than 120, and further preferably not more than 300 and not less than 170.

Examples of the organic silicon compound include cyclic organic silicon compounds such as a cyclic siloxane, a cyclic silazane and the like, other non-cyclic organic silicon compounds. Of these, a cyclic siloxane is preferable.

As the aforementioned organic silicon compound, more specifically, at least one kind of a cyclic siloxane represented by the following general formula (I) is preferable.

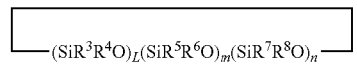

wherein $R^3$, $R^4$, $R^5$, $R^6$, $R^7$ and $R^8$ may be the same or different and each represents H, OH, $C_6H_5$, $C_aH_{2a+1}$, $CF_3(CF_2)_b(CH_2)_c$, $C_dH_{2d-1}$, $OC_eH_{2e+1}$ or a halogen atom; a is an integer between 1 and 3; b is an integer between 0 and 10; c is an integer between 0 and 4; d is an integer between 2 and 4; e is an integer between 1 and 6; L is an integer between 0 and 8; m is an integer between 0 and 8; n is an integer between 0 and 8 and $3 \leq L+m+n \leq 8$; and wherein at least two or more Si-A bond units (wherein A represents H, OH, $OC_eH_{2e+1}$ or a halogen atom and may be the same or different within a single molecule) are included.

More preferably, at least one kind of a cyclic siloxane represented by the following general formula is preferable.

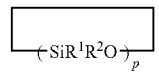

wherein $R^1$ and $R^2$ may be the same or different and each represents H, OH, $C_6H_5$, $C_aH_{2a+1}$, $CF_3(CF_2)_b(CH_2)_c$, $C_dH_{2d-1}$, $OC_eH_{2e+1}$ or a halogen atom; a is an integer between 1 and 3; b is an integer between 0 and 10; c is an integer between 0 and 4; d is an integer between 2 and 4; e is an integer between 1 and 6; p is an integer between 3 and 8; and wherein at least two or more Si-A bond units (wherein A represents H, OH, $OC_eH_{2e+1}$ or a halogen atom and may be the same or different within a single molecule) are included.

Specific examples thereof include cyclic siloxanes such as (3,3,3-trifluoropropyl)methylcyclotrisiloxane, triphenyltrimethylcyclotrisloxane, 1,3,5,7-tetramethylcyclotetrasiloxane, octamethylcyclotetrasiloxane, I,3,5,7-tetramethyl-1,3,5,7-tetraphenylcyclotetrasiloxane, tetraethylcyclotetrasiloxane, pentamethylcyclopentasiloxane and the like. Of these, use of 1,3,5,7-tetramethylcyclotetrasiloxane is particularly preferable.

Furthermore, as the aforementioned organic silicon compound, at least one kind of an organic silicon compound represented by the following general formula (II) can also be used.

$$YSiR^{10}R^{11}ZSiR^{12}R^{13}Y$$

wherein $R^{10}$, $R^{11}$, $R^{12}$ and $R^{13}$ may be the same or different and each represents H, $C_6H_5$, $C_aH_{2a+1}$, $CF_3(CF_2)_b(CH_2)_c$, $OC_eH_{2e+1}$ or a halogen atom; a is an integer between 1 and 3; b is an integer between 0 and 10; c is an integer between 0 and 4; e is an integer between 1 and 6; Z is O, $(CH_2)_d$, $C_6H_4$, $(OSiR^aR^b)_nO$, $OSiR^cR^dQSiR^eR^fO$ or $NR^g$; $R^a$, $R^b$, $R^c$, $R^d$, $R^e$, $R^f$ may be the same or different and each represents H, OH, $C_6H_5$, $C_aH_{2a+1}$, $CF_3(CF_2)_b(CH_2)_c$, a halogen atom or $OSiR^hR^iR^j$; a is an integer between 1 and 3; b is an integer between 0 and 10; c is an integer between 0 and 4; d is an integer of 1 or 2; n is an integer between 1 and 10; Q represents $(CH_2)_m$ or $C_6H_4$; m is an integer between 1 and 6; $R^h$, $R^i$, $R^j$ may be the same or different and each represents H or $CH_3$; $R^g$ represents $(CH_2)_p$ or $C_6H_4$; p is an integer between 1 and 6; two Ys may be the same or different and each represents H, OH, $C_6H_5$, $C_aH_{2a+1}$, $CF_3(CF_2)_b(CH_2)_c$, $OC_eH_{2e+1}$ or a halogen atom; a is an integer between 1 and 3; b is an integer between 0 and 10; c is an integer between 0 and 4; e is an integer between 1 and 6; and wherein at least any two or more of $R^a$ or $R^b$, $R^c$ or $R^d$, $R^e$ or $R^f$, 2 Ys represent H, OH, $OC_eH_{2e+1}$ or halogen atoms.

Specific examples thereof include siloxane compounds such as 1,2-bis(tetramethyldisiloxanyl)ethane, 1,3-bis(trimethylsiloxy)-1,3-dimethyldisiloxane, 1,1,3,3-tetraisopropyldisiloxane, 1,1,3,3-tetramethyldisiloxane, 1,1,3,3-tetraethyldisiloxane, 1,1,3,3-tetraphenyldisiloxane, 1,1,4,4-tetramethyldisilethylene, 1,1,3,3,5,5-hexamethyltrisiloxane, 1,1,3,3,5,5-hexaethyltrisiloxane, 1,1,3,3,5,5-hexaisopropyltrisiloxane, 1,1,3,3,5,5,7,7-octamethyltetrasiloxane, 1,1,1,3,5,5-hexamethyltrisiloxane, 1,1,1,3,3,5,7,7-octamethyltetrasiloxane, 1,3-dimethyltetramethoxydisiloxane, 1,1,3,3-tetramethyl-1,3-diethoxydisiloxane, 1,1,3,3,5,5-hexamethyldiethoxytrisiloxane, tetramethyl-1,3-dimethoxydisiloxane and the like.

Furthermore, as the aforementioned organic silicon compound, at least one kind of a cyclic silazane represented by the following general formula (III) can also be used.

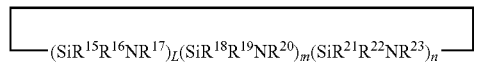

wherein $R^{15}$, $R^{16}$, $R^{18}$, $R^{19}$, $R^{21}$ and $R^{22}$ may be the same or different and each represents H, OH, $C_6H_5$, $C_aH_{2a+1}$, $CF_3(CF_2)_b(CH_2)_c$, $OC_eH_{2e+1}$ or a halogen atom; $R^{17}$, $R^{20}$ and $R^{23}$ may be same or different and each represents $C_6H_5$ or $C_aH_{2a+1}$; a is an integer of 1 or 2; b is an integer between 0 and 10; c is an integer between 0 and 4; e is an integer between 1 and 6; L is an integer between 0 and 8; m is an integer between 0 and 8; n is an integer between 0 and 8 and $3 \leq L+m+n \leq 8$; and wherein at least two or more Si-A bond units (wherein A represents H, OH, $OC_eH_{2e+1}$ or a halogen atom and may be the same or different within a single molecule) are included.

Specific examples thereof include cyclic silazane compounds such as 1,2,3,4,5,6-hexamethylcyclotrisilazane, 1,3,5,7-tetraethyl-2,4,6,8-tetramethylcyclotetrasilazane, 1,2,3-triethyl-2,4,6-triethylcyclotrisilazane and the like.

When the aforementioned organic silicon compound is used for modifying the porous film of the present invention, it may be used singly or in combination of two or more kinds selected from a cyclic siloxane represented by the general formula (1), an organic silicon compound represented by the general formula (II) and a cyclic silazane represented by the general formula (III). Of these, a cyclic siloxane represented by the general formula (I) is preferable.

The contact of the porous film with the foregoing organic silicon compound can be conducted under a liquid phase atmosphere or a gas phase atmosphere. When the contact treatment is carried out in a liquid phase, an organic solvent may be used for the treatment. As an organic solvent which can be used, there can be exemplified, for example, alcohols such as methanol, ethanol, n-propyl alcohol, isopropyl alcohol and the like; ethers such as diethyl ether, diethylene glycol dimethyl ether, 1,4-dioxane, tetrahydrofuran and the like; aryl alkanes such as benzene, toluene, xylene and the like. When the contact treatment is carried out in an organic solvent, the concentration of the foregoing organic silicon compound is not particularly restricted and any arbitrary concentration can be employed.

When the contact treatment is carried out in a gas phase, the foregoing organic silicon compound may be diluted with gas. As diluting gas which can be used, there can be exemplified, for example, air, nitrogen, argon, hydrogen or the like. Further, instead of diluting with gas, the contact treatment may be carried out under reduced pressure. As for an atmosphere, in a gas phase atmosphere is preferable as the recovery of the solvent or the dry process is not required. When an organic silicon compound is diluted with gas, the concentration of the organic silicon compound is not particularly restricted as far as it is not less than 0.1 vol %. Further, gas containing an organic silicon compound which is arbitrarily diluted may be contacted therewith while air is permeating, may be contacted therewith while gas is recycling or may be contacted therewith at a state that it is sealed in an airtight vessel.

The temperature for a thermal treatment of a porous film and the foregoing organic silicon compound is preferably in the range of 100 to 600° C. and more preferably in the range of 300 to 450° C. Any method of heating may be good as far as the temperature of a substrate can be maintained uniformly, for example, using a hot plate or an electric furnace. It is not particularly restricted. When the temperature for a thermal treatment is within the range, the temperature is low so that proceeding of the thermal treatment is never hindered by the temperature and no undesirable reaction caused by high temperature occurs. Thus, the thermal treatment can proceed in an effective manner. The porous film may be slowly heated up to the temperature for the thermal treatment. Or, when the temperature for a thermal treatment is lower than the calcining temperature, the porous film may be put in an atmosphere reaching the temperature for a thermal treatment at a time. If so, no particular problems are expected. The thermal treatment can be carried out subsequently after calcining the porous film. The time required for a thermal treatment of the porous film and the foregoing organic silicon compound is different depending on the treatment temperature, but it usually takes for several minutes to 40 hours and preferably for 10 minutes to 24 hours.

In the present invention, the hydrophobic property and the mechanical strength are considered to be improved mainly by the reaction of a silanol group which is present on the surface of the porous film and the foregoing organic silicon compound. The silanol group is generally present on the surface of a porous film mainly having Si—O bonds. In particular, in case of a porous film, many of silanol groups are present within its pores. By introducing a hydrophobic group, it is possible to reduce the number of silanol groups. In the thermal treatment up to 600° C., however, it is difficult to completely remove the silanol groups. When the temperature for a thermal treatment is increased, dehydration further proceeds so that the number of silanol groups is reduced. Therefore, addition of water to a porous film increases the number of silanol groups by the hydrolysis so that the organic silicon compound can easily react with it. So, such addition is desirable for the modification treatment for improving the hydrophobic property and the mechanical strength.

For the reasons described above, when the porous film is brought into contact with the organic silicon compound, the modification treatment may be carried out by addition of water. The amount of water added is properly determined according to the kind of an organic silicon compound which is brought into contact with the porous film. However, in a gas phase, it is preferably in the range corresponding to the partial pressure of from 0.05 to 25 kPa. Within this range, the modification treatment is free from bad influences such that any effect might not exhibit because too little water is added and the pore structure might be collapsed because of too much water. Further, the temperature for addition of water is not particularly restricted as far as it is not more than the reaction temperature. The method of addition is not particularly restricted. However, it is preferable that water is added before contact with the organic silicon compound. In this case, a reaction never occurs in the other place than the surface of the film because water is not present in the gas phase. So, the modification can be effectively treated with the organic silicon compound.

As described above, the porous film is subject to a thermal treatment by bringing it into contact with the foregoing organic silicon compound, thereby improving the hydrophobic property and the mechanical strength. It is considered that a film is formed on at least a part of the surface by a reactant comprising any of the organic silicon compound reacted on the surface of the porous film and bonded with the surface, other organic silicon compound polymerized thereto, or an organic silicon compound that is polymerized. As a result, it is considered that not only the hydrophobic property is exhibited, but also the mechanical strength is improved. The surface of the porous film mentioned herein refers to not only the outer surface of the film, but also the surface inside the pore.

The modification reaction mechanism of the porous film according to the present invention is not clear. However, in case of a silica film, a silanol group on the film surface and an organic silicon compound are bonded. The organic silicon compound bonded with the surface is reacted (polymerized) with the organic silicon compound so that a siloxane polymer is grown. To this, an organic silicon compound bonded to a silanol group on the other surface or the siloxane polymer is expected to be bonded.

When this reaction happens within pores, the reacted organic silicon compound is considered to form a structure like ivy trailing on the surface within pores for coating, while the reacted organic silicon compound is considered to form a bridging structure like a column within pores having the pore diameter of several nm. Such a peculiar structure to be formed within pores is considered not only to exhibit the hydrophobic property and but also to contribute to exhibition of the mechanical strength, which have not been conventionally known.

Accordingly, this reaction needs to proceed on the surface within pores of the film. To do so, it is preferable that a catalyst does not coexist with the supplied organic silicon compound at a temperature of from 100 to 600° C. for enabling a thermal treatment. Particularly, it is not preferable that a catalyst is used together with an organic silicon compound. It does not particularly matter if a catalyst exists in the porous film. However, when a catalyst is a metal, a metal remains in the film, which causes an increase in the relative permittivity of the film. So, it is not desirable. Therefore, it is important that a thermal treatment is carried out without using a metal catalyst for the modification treatment of the present invention.

However, in the conventional hydrophobicity method using a silylating agent in addition to the organic silicon compound, for example, hexamethyldisilazane (HMDS), as silanol groups on the film surface are changed just into trimethylsilyl groups, remarkable improvement of the mechanical strength of the film itself can not be expected. For this reason, it is difficult to use a silane compound as a silylating agent that has been used for the conventional hydrophobicity, as a reinforcing agent. Accordingly, it is desirable that an organic silicon compound as a modifier forms bonds on the film surface alone, and the modifier itself does not cause a decomposition reaction or the like and can maintain its skeleton.

An organic silicon compound used for the modification treatment of the present invention has one or more Si—X—Si bond unit (wherein X represents O, NR, $C_nH_{2n}$ or $C_6H_4$; R represents $C_mH_{2m+1}$ or $C_6H_5$; m is an integer between 1 and 6, n is 1 or 2) and two or more Si-A bond units (wherein A represents H, OH, $OC_eH_{2e+1}$ or a halogen atom and may be the same or different within a single molecule; e is an integer between 1 and 6). Therefore, both the hydrophobic property and the mechanical strength can be improved.

X is not particularly restricted as far as it is strongly bonded to Si even in a thermal treatment. Considering that a porous film mainly has Si—O bonds, X is preferably O. Furthermore, there are from 1 to 6 Si—X—Si bond units in order to improve the hydrophobic property and the mechanical strength, showing effects. From 2 to 4 continuously bonded Si—X—Si bond units are preferable and cyclically bonded Si—X—Si bond units are more preferable. Further, the number of the SI-A bond unit is not particularly restricted as far as it is not less than 2.

Of the Si-A bond units, Si—H bond units are particularly preferable. The organic silicon compound forms Si—OH by the reaction with water, which causes a dehydrocondensation reaction with other OH groups. In the case of Si—H, a dehydration can happen directly with Si—OH present on the surface. An organic silicon compound having an OH group from the beginning may be used. However, in this case, because of high reactivity, the ratio of such a compound that is diffused into pores and reacts with the wall is reduced. Reactivity is, when A is hydrogen, an alkoxy group or a halogen atom, in the order of a halogen atom>an alkoxy group>hydrogen.

As for an organic silicon compound having a Si-A bond unit, it is preferable that the boiling point is low, it is easy to handle and it is easy to diffuse due to little steric hindrance. When A is a halogen atom, A becomes easily reactive. As described above, the ratio of a halogen atom that is diffused into pores and reacts with the wall is reduced. In addition, when A is an alkoxy group (OR), it is considered that diffusion into mesopores is slow and alcohol generated by the reaction interacts with water, thereby preventing Si—OR from reacting with water. From the aforementioned facts, of Si-A bond units, a Si—H bond unit is considered the most effective to meet the object of the present invention.

In the present invention, the porous film used to obtain the modified porous film which is excellent in the hydrophobic property and the mechanical strength may be in a state of self-supporting film or a state that a film is formed on the substrate. Furthermore, after the porous film is treated with the organic silicon compound, no troubles such as contamination, coloring or the like occur. Thus, when a transparent one is needed, the porous film can be used.

In the present invention, the hydrophobic property of the porous film can be confirmed by measuring the relative permittivity. Having high relative permittivity indicates insufficiency of the hydrophobic property. The relative permittivity can be measured according to the conventional method at 25° C. under an atmosphere of 50% relative humidity, at a frequency of 100 kHz. To do so, aluminum electrodes are formed on the surface of the porous film formed on a surface of a silicon wafer and the back surface of the silicon wafer according to the vapor deposition method.

Furthermore, the mechanical strength of the porous film of the present invention is confirmed by measuring the elastic modulus of the film using nanoindenter. Nanoindenter measurement of the present invention was carried out using the Triboscope system manufactured by Hysitron Inc.

The modified porous film according to the present invention is excellent both in the hydrophobic property and the mechanical strength so that it can be used for optical and electronic materials such as interlayer insulating film, molecular recording medium, transparent conductive film, solid electrolyte, optical waveguide, LCD color member and the like. In particular, an interlayer insulating film as a semiconductor material is required to have strength, heat resistance and low permittivity, to which therefore the porous film obtained according to the present invention that is excellent in the hydrophobic property and the mechanical strength can be preferably applied. Conventionally, semiconductor materials with low permittivity comprising this porous film could not be prepared. According to the present invention, it is possible to prepare such a film and the film can be used for semiconductor devices.

Next, an example of a semiconductor device using the modified porous film according to the present invention as an interlayer insulating film is described in detail.

First of all, as described above, a porous film is formed on a surface of a silicon wafer, the porous film is brought into contact with the foregoing organic silicon compound for modification. Then, the modified porous film is patterned by photoresist and etched according to the pattern. After removing photoresist, a barrier film comprising titanium nitride (TiN), tantalum nitride (TaN) or the like is formed on the surface of the porous film and the surface of etched portion by a gas-phase growth method. After that, a copper film is formed by a metal CVD method, a sputtering method or an electroplating method and then unnecessary copper film is removed by CMP (Chemical Mechanical Polishing) for forming a circuit wiring. Subsequently, a cap film (for example, a film comprising silicon carbide) is formed on the surface. Further, as required, a hard mask film (for example, a film comprising silicon nitride) is formed and multilayered by repeating the aforementioned process. The thus-obtained film is segmented to semiconductor chips and mounted on a package. Thus, a semiconductor device according to the present invention can be produced.

EXAMPLES

The present invention is now more specifically illustrated below with reference to Examples. The present invention is not limited to these Examples.

Incidentally, the following samples were used in Examples and Comparative Examples.

Tetraethoxysilane (TEOS): EL Grade, $Si(OC_2H_5)_4$, manufactured by Kojundo Chemical Laboratory Co., Ltd.

Ethanol: For electronic industry, a product of Wako Pure Chemical Industries, Ltd.

Hydrochloric acid: For trace analysis, a product of Wako Pure Chemical Industries, Ltd.

Poly(alkylene oxide) block copolymer: Demetallized by weighing 70 g of $HO(CH_2CH_2O)_{20}(CH_2CH(CH_3)O)_{70}(CH_2CH_2O)_{20}H$ (Pluronic P123, manufactured by BASF), dissolving it in 700 g of ethanol, subjecting the resulting solution to ion exchange using an ionic exchange resin (SK1BH) manufactured by Nippon Rensui Co., and removing ethanol by distillation. $HO(CH_2CH_2O)_{106}(CH_2CH(CH_3)O)_{70}(CH_2CH_2O)_{106}H$ (Pluronic F127, manufactured by BASF) and $HO(CH_2CH_2O)_{39}(C_2H_4CH(CH_3)O)_{47}(CH_2CH_2O)_{39}H$ (a product of Mitsui Takeda Chemicals, Inc.): Demetallized for use as well.

Water: Demetallized water by a water purification system manufactured by Millipore Corp.

N,N-dimethylacetamide: For electronic industry, a product of Kanto Kagaku 1,3,5,7-tetramethylcyclotetrasiloxane: a product of AZmax Co.

Tridecafluoro-1,1,2,2-tetrahydrooctyl-1-triethyoxysilane: A product of Tokyo Kasei Kogyo Co., Ltd., $CF_3(CF_2)_5CH_2CH_2Si(OC_2H_5)_3$ 2-(methoxy(polyethyleneoxy)propyl)trimethylsilane: A product of AZmax Co., $CH_3O(CH_2CH_2O)_{6-9}(CH_2)_3Si(OCH_3)_3$ Methyltriethoxysilane: A product of Tokyo Kasei Kogyo Co., Ltd., $CH_3Si(OC_2H_5)_3$ 1,1,3,3,5,5-hexamethyltrisiloxane: A product of AZmax Co., $(CH_3)_2HSiOSi(CH_3)_2OSi(CH_3)_2H$

Example 1

(Preparation of a Coating Solution)

10.0 g of tetraethoxysilane and 10 mL of ethanol were mixed at a room temperature. Then, to the mixture, 1.0 mL of 1N hydrochloric acid was added, followed by stirring. 40 mL of ethanol was added thereto, followed by further stirring. To the solution, 8 mL of water was added, followed by stirring. A transparent homogeneous coating solution was obtained.

(Preparation of a Film)

Several ml droplets of the prepared coating solution were placed on a surface of an 8-inch silicon wafer, and the silicon wafer was rotated at 2,000 rpm for 10 seconds to coat the surface of the silicon wafer. And then the solution was dried at 100° C. for an hour and further calcined at 400° C. for 3 hours to prepare a porous film.

(Modification of a Porous Film)

A quarts reactor was charged with the porous film obtained as described above and allowed to stand for 30 minutes at a temperature of 400° C. under a nitrogen atmosphere of 500 mL/min. Then, nitrogen passes through in a 25° C. evaporator charged with 1,3,5,7-tetramethylcyclotetrasiloxane as an organic silicon compound and 1,3,5,7-tetramethylcyclotetrasiloxane was introduced along with nitrogen into the reactor. After an hour, introduction of 1,3,5,7-tetramethylcyclotetrasiloxane was stopped and the reactor was cooled down to 30° C. under a nitrogen atmosphere of 500 mL/min to obtain a modified porous film. The average pore diameter of the porous film was 1.5 nm. The average pore diameter was measured by the nitrogen adsorption method under a liquid nitrogen temperature (77K) using Autosorb-3B type (manufactured by Quantachrome Instruments), i.e., a 3-sample fully automatic gas adsorption apparatus.

(Measurement of Permittivity and Elastic Modulus)

The relative permittivity was obtained from electric capacity measured at 25° C. under an atmosphere of 50% relative humidity, at a frequency of 100 kHz, in the range of −40V to 40V and a film thickness measured by a Dectak film thickness meter. To do so, aluminum electrodes were formed on a surface of a porous film formed on a substrate and the back surface of a silicon wafer used as a substrate by the vapor deposition method to have a metal-insulating film-silicon-metal structure.

The elastic modulus of the porous film was measured by nanoindenter using the Triboscope system manufactured by Hysitron Inc.

The relative permittivity and elastic modulus measured for the porous film obtained before and after modification treatment of the porous film are shown in Table 1.

Example 2

10.0 g of tetraethoxysilane and 10 mL of ethanol were mixed at a room temperature. Then, to the mixture, 2.8 g of poly(alkylene oxide) block copolymer (Pluronic P123, manufactured by BASF) and a solution dissolved in 40 mL of ethanol were added, followed by stirring. To the solution, 8 mL of water was added, followed by stirring. A transparent homogeneous coating solution was obtained.

A porous film was prepared in the same manner as in Example 1. As a result of X-ray diffractometry, the porous film was found to retain a periodic 2D-hexagonal structure having area intervals of 7.0 nm. Also, the average pore diameter of the porous film was 5.8 nm. Next, modification was carried out in the same manner as in Example 1.

The relative permittivity and elastic modulus measured for the porous film obtained before and after modification treatment are shown in Table 1.

Example 3

10.0 g of tetraethoxysilane and 10 mL of ethanol were mixed at a room temperature. Then, to the mixture, 1.0 mL of 1N hydrochloric acid was added, followed by stirring. An (A) component solution was obtained. Further, 0.13 g of tridecafluoro-1,1,2,2-tetrahydrooctyl-1-triethoxysilane, 0.14 g of 2-(methoxy(polyethylene oxide)propyl)trimethylsilane and 10 mL of ethanol were mixed, followed by stirring. Then, to the mixture, 0.0035 mL of 1N hydrochloric acid was added, followed by stirring. A (B) component solution was obtained. Further 2.9 g of poly(alkylene oxide) block copolymer (a product of Mitsui Takeda Chemicals, Inc.) was dissolved in 30 mL of ethanol to obtain a (C) component solution. To the (C) component solution, the (B) component solution was added, followed by stirring. Subsequently, a mixed solution of the (C) component solution and (B) component solution was added to the (A) component solution, followed by stirring. To the solution, 8 mL of water was added, followed by stirring. A transparent homogeneous coating solution was obtained.

A porous film was prepared in the same manner as in Example 1. The thus-obtained porous film was confirmed to have a 3D-cubic structure by the X-ray diffractometry. Also, the average pore diameter of the porous film was 5.3 nm. Next, modification was carried out in the same manner as in Example 1. The relative permittivity and elastic modulus measured for the porous film obtained before and after modification treatment are shown in Table 1.

Example 4

2.7 g droplets of tetrapropylammoniumhydroxide dissolved in 15 g of water were placed on 10.0 g of tetraethoxysilane being violently stirred. Then, the resulting solution was stirred as intact under a room temperature and ripened at 30° C. for 3 days. A transparent homogeneous solution obtained was filled into a Teflon-coated autoclave and stirred at 80° C. for 3 days. As a result, crystallite was obtained. The obtained crystallite was recovered by a centrifuge, washed with ion exchange water and repeatedly centrifused until pH<8. Subsequently, a solution obtained by dissolving 2.8 g of poly(alkylene oxide) block copolymer (Pluronic P123, manufactured by BASF) in 40 mL of ethanol was added thereto. A coating solution containing a crystallite of zeolite was obtained.

A porous film was prepared in the same manner as in Example 1. The thus-obtained porous film was confirmed to have a zeolite structure by the X-ray diffractometry. Also, the porous film had pores having a peak at 7.1 nm in addition to pores derived from zeolite. Next, modification was carried out in the same manner as in Example 1. The relative permittivity and elastic modulus measured for the porous film obtained before and after modification treatment are shown in Table 1.

Example 5

10.0 g of tetraethoxysilane and 10 mL of ethanol were mixed at a room temperature. Then, to the mixture, 1.0 mL of 1N hydrochloric acid was added, followed by stirring. An (A) component solution was obtained. Further, 0.13 g of tridecafluoro-1,1,2,2-tetrahydrooctyl-1-triethoxysilane, 0.14 g of 2-(methoxy(polyethylene oxide)propyl)trimethylsilane, 0.061 g of methyltriethoxysilane and 10 mL of ethanol were mixed, followed by stirring. Then, to the mixture, 0.0035 mL of 1N hydrochloric acid was added, followed by stirring. A (B) component solution was obtained. Further, 2.8 g of poly (alkylene oxide) block copolymer (Pluronic P123, manufactured by BASF) was dissolved in 30 mL of ethanol to obtain a (C) component solution. To the (C) component solution, the (B) component solution was added, followed by stirring. A mixed solution of the (C) component solution and (B) component solution was added to the (A) component solution, followed by stirring. To the solution, 8 mL of water was added, followed by stirring. A transparent homogeneous coating solution was obtained.

A porous film was prepared in the same manner as in Example 1. As a result of X-ray diffractometry, the thus-obtained porous film was found to retain a 2D-hexagonal structure. Also, the average pore diameter of the porous film was 5.5 nm. Next, modification was carried out in the same manner as in Example 1. The relative permittivity and elastic modulus measured for the porous film obtained before and after modification treatment are shown in Table 1.

Example 6

10.0 g of tetraethoxysilane and 10 mL of ethanol were mixed at a room temperature. Then, to the mixture, 1.0 mL of 1N hydrochloric acid was added, followed by stirring. An (A) component solution was obtained. Further, 0.60 g of tridecafluoro-1,1,2,2-tetrahydrooctyl-1-triethoxysilane, 0.63 g of 2-(methoxy(polyethylene oxy)propyl)trimethylsilane, 0.14 g of methyltriethoxysilane and 10 mL of ethanol were mixed, followed by stirring. Then, to the mixture, 0.046 mL of 1N hydrochloric acid was added, followed by stirring. A (B) component solution was obtained. Further, 2.8 g of poly(alkylene oxide) block copolymer (Pluronic P123, manufactured by BASF) was dissolved in 30 mL of ethanol to obtain a (C) component solution. To the (C) component solution, the (B) component solution was added, followed by stirring. Subsequently, a mixed solution of the (C) component solution and (B) component solution was added to the (A) component solution, followed by stirring. To the solution, 8 mL of water was added, followed by stirring. A transparent homogeneous coating solution was obtained.

A porous film was prepared in the same manner as in Example 1. As a result of X-ray diffractometry, the thus-obtained porous film was found to retain a 2D-hexagonal structure. Also, the average pore diameter of the porous film was 5.2 nm. Next, modification was carried out in the same manner as in Example 1. The relative permittivity and elastic modulus measured for the porous film obtained before and after modification treatment are shown in Table 1.

Example 7

10.0 g of tetraethoxysilane and 10 mL of ethanol were mixed at a room temperature. Then, to the mixture, 1.0 mL of 1N hydrochloric acid was added, followed by stirring. An (A) component solution was obtained. Further, 0.13 g of tridecafluoro-1,1,2,2-tetrahydrooctyl-1-triethoxysilane, 0.14 g of 2-(methoxy(polyethylene oxy)propyl)trimethylsilane and 10 mL of ethanol were mixed, followed by stirring. Then, to the mixture, 0.0014 mL of 1N hydrochloric acid was added, followed by stirring. A (B) component solution was obtained. Further, 2.8 g of poly(alkylene oxide) block copolymer (Pluronic P123, manufactured by BASF) was dissolved in 30 mL of ethanol to obtain a (C) component solution. To the (C) component solution, the (B) component solution was added, followed by stirring. Subsequently, a mixed solution of the (C) component solution and (B) component solution was added to the (A) component solution, followed by stirring. To the solution, 8 mL of water was added, followed by stirring. A transparent homogeneous coating solution was obtained.

A porous film was prepared in the same manner as in Example 1. As a result of X-ray diffractometry, the thus-obtained porous film was found to retain a 2D-hexagonal structure. Also, the average pore diameter of the porous film was 5.5 nm. Next, modification was carried out in the same manner as in Example 1. The relative permittivity and elastic modulus measured for the porous film obtained before and after modification treatment are shown in Table 1.

Example 8

10.0 g of tetraethoxysilane and 10 mL of ethanol were mixed at a room temperature. Then, to the mixture, 1.0 mL of 1N hydrochloric acid was added, followed by stirring. An (A) component solution was obtained. Further, 0.20 g of tridecafluoro-1,1,2,2-tetrahydrooctyl-1-triethoxysilane, 0.21 g of 2-(methoxy(polyethylene oxy)propyl)trimethylsilane and 10 mL of ethanol were mixed, followed by stirring. Then, to the mixture, 0.021 mL of 1N hydrochloric acid was added, followed by stirring. A (B) component solution was obtained. Further, 2.8 g of poly(alkylene oxide) block copolymer (Pluronic P123, manufactured by BASF) was dissolved in 30 mL of ethanol to obtain a (C) component solution. To the (C) component solution, the (B) component solution was added, followed by stirring. Subsequently, a mixed solution of the (C) component solution and (B) component solution was added to the (A) component solution, followed by stirring. To the solution, 8 mL of water was added, followed by stirring. A transparent homogeneous coating solution was obtained.

A porous film was prepared in the same manner as in Example 1. As a result of X-ray diffractometry, the thus-obtained porous film was found to retain a 2D-hexagonal structure. Also, the average pore diameter of the porous film was 5.4 nm. Next, modification was carried out in the same manner as in Example 1. The relative permittivity and elastic modulus measured for the porous film obtained before and after modification treatment are shown in Table 1.

Example 9

10.0 g of tetraethoxysilane and 10 mL of ethanol were mixed at a room temperature. Then, to the mixture, 1.0 mL of 1N hydrochloric acid was added, followed by stirring. An (A) component solution was obtained. Further, 0.07 g of tridecafluoro-1,1,2,2-tetrahydrooctyl-1-triethoxysilane, 0.07 g of 2-(methoxy(polyethylene oxy)propyl)trimethylsilane and 10 mL of ethanol were mixed, followed by stirring. Then, to the mixture, 0.007 mL of 1N hydrochloric acid was added, followed by stirring. A (B) component solution was obtained. Further, 2.8 g of poly(alkylene oxide) block copolymer (Pluronic P123, manufactured by BASF) was dissolved in 30 mL of ethanol to obtain a (C) component solution. To the (C) component solution, the (B) component solution was added, followed by stirring. Subsequently, a mixed solution of the (C) component solution and (B) component solution was added to the (A) component solution, followed by stirring. To the solution, 8 mL of water was added, followed by stirring. A transparent homogeneous coating solution was obtained.

A porous film was prepared in the same manner as in Example 1. As a result of X-ray diffractometry, the thus-obtained porous film was found to retain a 2D-hexagonal structure. Also, the average pore diameter of the porous film was 5.5 nm. Next, modification was carried out in the same manner as in Example 1. The relative permittivity and elastic modulus measured for the porous film obtained before and after modification treatment are shown in Table 1.

Example 10

8.1 g of tetraethoxysilane, 1.5 g of methyltriethoxysilane and 8 mL of ethanol were mixed at a room temperature. Then, to the mixture, 1.0 mL of 1N hydrochloric acid was added, followed by stirring. An (A) component solution was obtained. Further, 2.8 g of poly(alkylene oxide) block copolymer (Pluronic P123, manufactured by BASF) was dissolved in 32 mL of ethanol to obtain a (B) component solution. The (B) component solution was added to the (A) component solution, followed by stirring. To the solution, 8 g of water was added, followed by stirring. A transparent homogeneous coating solution was obtained.

A porous film was prepared in the same manner as in Example 1. As a result of X-ray diffractometry, the thus-obtained porous film was found to retain a 2D-hexagonal structure. Also, the average pore diameter of the porous film was 4.9 nm. Next, modification was carried out in the same manner as in Example 1. The relative permittivity and elastic modulus measured for the porous film obtained before and after modification treatment are shown in Table 1.

Example 11

5.1 g of tetraethoxysilane, 3.6 g of methyltriethoxysilane and 8 mL of ethanol were mixed at a room temperature. Then, to the mixture, 1.0 mL of 1N hydrochloric acid was added, followed by stirring. An (A) component solution was obtained. Further, 2.8 g of poly(alkylene oxide) block copolymer (Pluronic P123, manufactured by BASF) was dissolved in 32 mL of ethanol to obtain a (B) component solution. The (B) component solution was added to the (A) component solution, followed by stirring. To the solution, 8 g of water was added, followed by stirring. A transparent homogeneous coating solution was obtained.

A porous film was prepared in the same manner as in Example 1. As a result of X-ray diffractometry, the thus-obtained porous film was found to retain a 2D-hexagonal structure. Also, the average pore diameter of the porous film was 4.9 nm. Next, modification was carried out in the same manner as in Example 1. The relative permittivity and elastic modulus measured for the porous film obtained before and after modification treatment are shown in Table 1.

Example 12

8.1 g of tetraethoxysilane, 1.4 g of dimethyldiethoxysilane and 8 mL of ethanol were mixed at a room temperature. Then, to the mixture, 1.0 mL of 1N hydrochloric acid was added, followed by stirring. An (A) component solution was obtained. Further, 2.8 g of poly(alkylene oxide) block copolymer (Pluronic P123, manufactured by BASF) was dissolved in 32 mL of ethanol to obtain a (B) component solution. The (B) component solution was added to the (A) component solution, followed by stirring. To the solution, 8 g of water was added, followed by stirring. A transparent homogeneous coating solution was obtained.

A porous film was prepared in the same manner as in Example 1. As a result of X-ray diffractometry, the thus-obtained porous film was found to retain a 2D-hexagonal structure. Also, the average pore diameter of the porous film was 5.0 nm. Next, modification was carried out in the same manner as in Example 1. The relative permittivity and elastic modulus measured for the porous film obtained before and after modification treatment are shown in Table 1.

Example 13

5.0 g of tetraethoxysilane, 3.6 g of dimethyldiethoxysilane and 8 mL of ethanol were mixed at a room temperature. Then, to the mixture, 1.0 mL of 1N hydrochloric acid was added, followed by stirring. An (A) component solution was obtained. Further, 2.8 g of poly(alkylene oxide) block copolymer (Pluronic P123, manufactured by BASF) was dissolved in 32 mL of ethanol to obtain a (B) component solution. The (B) component solution was added to the (A) component solution, followed by stirring. To the solution, 8 g of water was added, followed by stirring. A transparent homogeneous coating solution was obtained.

A porous film was prepared in the same manner as in Example 1. As a result of X-ray diffractometry, no clear periodic arrangement was shown. Also, the average pore diameter of the porous film was 4.9 nm. Next, modification was carried out in the same manner as in Example 1. The relative permittivity and elastic modulus measured for the porous film obtained before and after modification treatment are shown in Table 1.

Example 14

The modification was carried in the same manner as in Example 2 except that water was introduced as well by passing the introduced gas through in an evaporator of 25° C. water. The relative permittivity and elastic modulus measured for the porous film obtained before and after modification treatment are shown in Table 2.

Example 15

The modification was carried in the same manner as in Example 2 except that the temperature for modification treatment was changed to 250° C. from 400° C. The relative permittivity and elastic modulus measured for the porous film obtained before and after modification treatment are shown in Table 2.

Example 16

The modification was carried in the same manner as in Example 2 except that the time required for modification treatment was changed to 5 minutes from 30 minutes. The relative permittivity and elastic modulus measured for the porous film obtained before and after modification treatment are shown in Table 2.

Example 17

The modification was carried in the same manner as in Example 2 except that a modifier was changed to 1,1,3,3,5,5-hexamethyltrisiloxane from 1,3,5,7-tetramethylcyclotetrasiloxane. The relative permittivity and elastic modulus measured for the porous film obtained before and after modification treatment are shown in Table 2.

Example 18

The modification was carried in the same manner as in Example 2 except that a flow type introducing 1,3,5,7-tetramethylcyclotetrasiloxane along with nitrogen at a flow rate of 500 mL/min into a reactor was changed to a batch type filling 2.5 vol % of 1,3,5,7-tetramethylcyclotetrasiloxane in a system. The relative permittivity and elastic modulus measured for the porous film obtained before and after modification treatment are shown in Table 2.

Example 19

10.0 g of tetraethoxysilane and 10 mL of ethanol were mixed at a room temperature. Then, to the mixture, 1.0 mL of 1N hydrochloric acid and 10.0 mL of water were added, followed by stirring. Further, 6.5 g of poly(alkylene oxide) block copolymer (Pluronic F127, manufactured by BASF) dissolved in 60 mL of ethanol was further added, followed by stirring. A transparent homogeneous coating solution was obtained.

A porous film was prepared and modification was carried in the same manner as in Example 1.

A porous film before modification was found to retain a cubic structure having area intervals of 83 nm by the X-ray diffractometry. The relative permittivity k of the film was k=5.6. Further, using a high resolution electron microscope (HREM) (model: JEM-3010, manufactured by JEOL Ltd.), the pore diameter was measured from the electron density distribution (the electron beam structure analysis) obtained by Fourier Transform of the electron diffraction point. As a result, the porous film had a narrow part having the pore diameter of approximately 15 Å within pores. The average pore diameter of the porous film was 7.0 nm. The relative permittivity k of the modified porous film after modification was k=2.1. Further, the thus-modified porous film was put into a vacuum chamber, introducing vapor of 10% pentakis (ethylmethylamide)tantalum-containing isopropyl alcohol and NH$_3$ gas into the chamber, and forming a film with TaN on the porous film at a reaction temperature of 400° C., at a reaction pressure of 5 Torr. As a result of cross sectional TEM observation of the porous film after forming a film with TaN, TaN diffusion into the pore was not observed.

Example 20

10.4 g of tetraethoxysilane and 10 mL of ethanol were mixed and stirred at a room temperature. Then, to the mixture, 1.0 mL of 1N hydrochloric acid and 10.0 mL of water were added, followed by stirring. After stirring, a mixture solution obtained by dissolving 2.8 g of poly(alkylene oxide) block copolymer (Pluronic P123, manufactured by BASF) and 1.5 g of a block copolymer (DBP-732, manufactured by AZmax Co., demetallized one like poly(alkylene oxide) block copolymer) of polydimethylsiloxane, polyethylene oxide and polypropylene oxide in 60 mL of ethanol was added thereto, followed by further stirring. A transparent homogeneous coating solution was obtained.

A porous film was prepared and modification was carried in the same manner as in Example 1.

A porous film before modification was found to retain a 2-D hexagonal structure having area intervals of 7.0 nm by the X-ray diffractometry. The relative permittivity k of the film was k=4.8. Further, as a result of cross sectional TEM observation, the porous film had a narrow part having the pore diameter of approximately 10 Å within pores. The average pore diameter of the porous film was 5.9 nm. The relative permittivity k of the film after modification was k=2.3. Further, the modified porous film was put into a vacuum chamber, introducing vapor of 10% pentakis(ethylmethylamide)tantalum-containing isopropyl alcohol and NH$_3$ gas into the chamber and forming a film with TaN on the porous film at a reaction temperature of 400° C., at a reaction pressure of 5 Torr. After forming a film with TaN, as a result of cross sectional TEM observation of the porous film, TaN diffusion into the pore was not observed.

Comparative Example 1

The modification was carried in the same manner as in Example 2 except that 1,3,5,7-tetramethylcyclotetrasiloxane was changed to hexamethyldisilazane. The relative permittivity and elastic modulus measured for the porous film obtained before and after modification treatment are shown in Table 3.

Comparative Example 2

The modification was carried in the same manner as in Example 2 except that 1,3,5,7-tetramethylcyclotetrasiloxane was changed to trimethylsilylchloride. The relative permittivity and elastic modulus measured for the porous film obtained before and after modification treatment are shown in Table 3.

TABLE 1

| Example | Before modification | | After modification | |
| --- | --- | --- | --- | --- |
| | Relative Permittivity | Elastic Modulus (GPa) | Relative Permittivity | Elastic Modulus (GPa) |
| 1 | 4.2 | 10.1 | 3.8 | 13.2 |
| 2 | 4.5 | 5.1 | 2.2 | 8.4 |
| 3 | Unable to measure | 3.0 | 3.1 | 4.9 |
| 4 | 3.2 | 8.0 | 3.1 | 10.1 |
| 5 | 3.0 | 2.2 | 2.6 | 5.5 |
| 6 | 2.2 | 1.9 | 2.0 | 3.5 |
| 7 | 2.4 | 1.6 | 2.0 | 4.9 |
| 8 | 2.4 | 0.8 | 2.6 | 2.5 |
| 9 | 3.1 | 4.4 | 2.6 | 7.6 |
| 10 | 3.4 | 1.3 | 2.6 | 5.1 |
| 11 | 2.0 | 1.1 | 2.2 | 2.9 |
| 12 | 2.2 | 1.2 | 2.5 | 4.2 |
| 13 | 2.0 | 0.8 | 2.3 | 2.2 |

TABLE 2

| Example | Before modification | | After modification | |
| --- | --- | --- | --- | --- |
| | Relative Permittivity | Elastic Modulus (GPa) | Relative Permittivity | Elastic Modulus (GPa) |
| 14 | 4.5 | 5.1 | 3.4 | 9.1 |
| 15 | 4.5 | 5.1 | 3.8 | 6.3 |
| 16 | 4.5 | 5.1 | 3.2 | 7.3 |
| 17 | 4.5 | 5.1 | 3.4 | 11.5 |
| 18 | 4.5 | 5.1 | 3.6 | 13.3 |

TABLE 3

| Comparative Example | Before modification | | After modification | |
| --- | --- | --- | --- | --- |
| | Relative Permittivity | Elastic Modulus (GPa) | Relative Permittivity | Elastic Modulus (GPa) |
| 1 | 4.5 | 5.1 | 2.4 | 6 |
| 2 | 4.5 | 5.1 | 2.7 | 4.9 |

INDUSTRIAL APPLICABILITY

The modified porous film obtained according to the present invention can be preferably used for an interlayer insulating film as a semiconductor material. The porous film is excellent in both the hydrophobic property and the mechanical strength, which can be used as an optically functional material or an electronically functional material. Thus, much larger scale integration of a semiconductor device can be achieved.

The invention claimed is:

1. A method for modifying a porous film mainly having Si—O bonds to obtain a modified porous film having a relative permittivity of 2.6 or less, the method comprising:

conducting a thermal treatment at a temperature from 100° C. to 600° C. to the porous film without using a metal catalyst, wherein in the thermal treatment, an outer surface of the porous film and an inside surface of a pore of the porous film are brought into contact with an organic silicon compound including one or more Si—O—Si bond unit and two or more Si-A bond units (wherein A represents H, OH, $OC_eH_{2e+1}$ or a halogen atom and may be the same or different within a single molecule; and e is an integer between 1 and 6), the organic silicon compound is a cyclic siloxane and the molecular weight of the cyclic siloxane is not more than 900, and wherein the contacting is carried out in a gas phase.

2. The method for modifying a porous film according to claim 1, wherein the porous film before the treatment is a film having mesopores.

3. The method for modifying a porous film according to claim 1, wherein an average pore diameter of the porous film before the treatment is in a range of 0.5 to 10 nm.

4. A modified porous film obtained by the method as described in claim 1.

5. A semiconductor material comprising the modified porous film as described in claim 4.

6. A semiconductor device in which the semiconductor material as described in claim 5 is used.

7. A modified porous film obtained by the method as described in claim 2.

8. A modified porous film obtained by the method as described in claim 3.

9. A semiconductor material comprising the modified porous film as described in claim 7.

10. A semiconductor device in which the semiconductor material as described in claim 9 is used.

11. A method for modifying a porous film mainly having Si—O bonds to obtain a modified porous film, the method comprising:

adding water to the porous film; and conducting a thermal treatment at a temperature from 100° C. to 600° C. to the porous film without using a metal catalyst, wherein in the thermal treatment, an outer surface of the porous film and an inside surface of a pore of the porous film are brought into contact with an organic silicon compound including one or more Si—O—Si bond unit and two or more Si-A bond units (wherein A represents H, OH, $OC_eH_{2e+1}$ or a halogen atom and may be the same or different within a single molecule; and e is an integer between 1 and 6), the organic silicon compound is a cyclic siloxane and the molecular weight of the cyclic siloxane is not more than 900, and wherein the contacting is carried out in a gas phase.

12. The method for modifying a porous film according to claim 11, wherein the water is added before contacting the outer surface of the porous film and an inside surface of a pore of the porous film with the organic silicon compound.

13. A method for modifying a porous film mainly having Si—O bonds to obtain a modified porous film, the method comprising:

conducting a thermal treatment at a temperature from 100° C. to 600° C. to the porous film without using a metal catalyst, wherein in the thermal treatment, an outer surface of the porous film and an inside surface of a pore of the porous film are brought into contact with an organic silicon compound including one or more Si—O—Si bond unit and two or more Si-A bond units (wherein A represents H, OH, $OC_eH_{2e+1}$ or a halogen atom and may be the same or different within a single molecule; and e is an integer between 1 and 6), the organic silicon compound is a cyclic siloxane and the molecular weight of the cyclic siloxane is not more than 900, and wherein the contacting is carried out in a gas phase comprising air.

* * * * *